(12) United States Patent
Dry et al.

(10) Patent No.: US 11,348,798 B2
(45) Date of Patent: May 31, 2022

(54) METHODS OF FORMING INTEGRATED CIRCUIT DEVICES USING CUTTING TOOLS TO EXPOSE METALLIZATION PADS THROUGH A CAP STRUCTURE AND RELATED CUTTING DEVICES

(71) Applicant: Akoustis, Inc., Huntersville, NC (US)

(72) Inventors: Robert C. Dry, Cornelius, NC (US);
Brook Hosse, Huntersville, NC (US)

(73) Assignee: Akoustis, Inc., Huntersville, NC (US)

( * ) Notice: Subject to any disclaimer, the term of this patent is extended or adjusted under 35 U.S.C. 154(b) by 107 days.

(21) Appl. No.: 16/784,912

(22) Filed: Feb. 7, 2020

(65) Prior Publication Data

US 2021/0249272 A1 Aug. 12, 2021

(51) Int. Cl.
*H01L 21/304* (2006.01)
*B28D 5/00* (2006.01)
*H03H 3/08* (2006.01)
*H01L 21/78* (2006.01)
*H03H 3/02* (2006.01)

(52) U.S. Cl.
CPC ........ *H01L 21/3043* (2013.01); *B28D 5/0029* (2013.01); *H01L 21/78* (2013.01); *H03H 3/02* (2013.01); *H03H 3/08* (2013.01)

(58) Field of Classification Search
None
See application file for complete search history.

(56) References Cited

U.S. PATENT DOCUMENTS

| 5,882,986 A | 3/1999 | Eng et al. |
| 2007/0173035 A1 | 7/2007 | Izumi |
| 2008/0113466 A1 | 5/2008 | Moriya et al. |
| 2011/0198733 A1 | 8/2011 | Tomisaka et al. |
| 2015/0099428 A1* | 4/2015 | Fujita ........................ B24D 5/12 451/28 |
| 2019/0013302 A1* | 1/2019 | Wang ...................... H01L 24/02 |

FOREIGN PATENT DOCUMENTS

EP 2413372 A2 2/2012

OTHER PUBLICATIONS

*Advanced Hub Blade for Improved Process Stability and Consistency*; Disco Corporation, Electroformed Bond Hub Blades' ZH05 series, www.disco.com, Jan. 2020; 2 pages.
International Search Report and Written Opinion, PCT/US2021/016520, dated Apr. 8, 2021, 7 pages.

* cited by examiner

*Primary Examiner* — Stephanie P Duclair
(74) *Attorney, Agent, or Firm* — Stanek Lemon Crouse & Meeks, P.A.

(57) ABSTRACT

A method of fabricating a semiconductor device can include providing an integrated circuit electrically coupled to a metallization pad on a semiconductor wafer, the integrated circuit and the metallization pad covered by a cap structure. A channel can be cut in a portion of the cap structure that covers the metallization pad using a cutting tool having a tip surface and a beveled side surface to expose an upper surface of the metallization pad in the channel extending in a first direction and a conductive material can be deposited in the channel to ohmically contact the upper surface of the metallization pad in the channel.

21 Claims, 9 Drawing Sheets

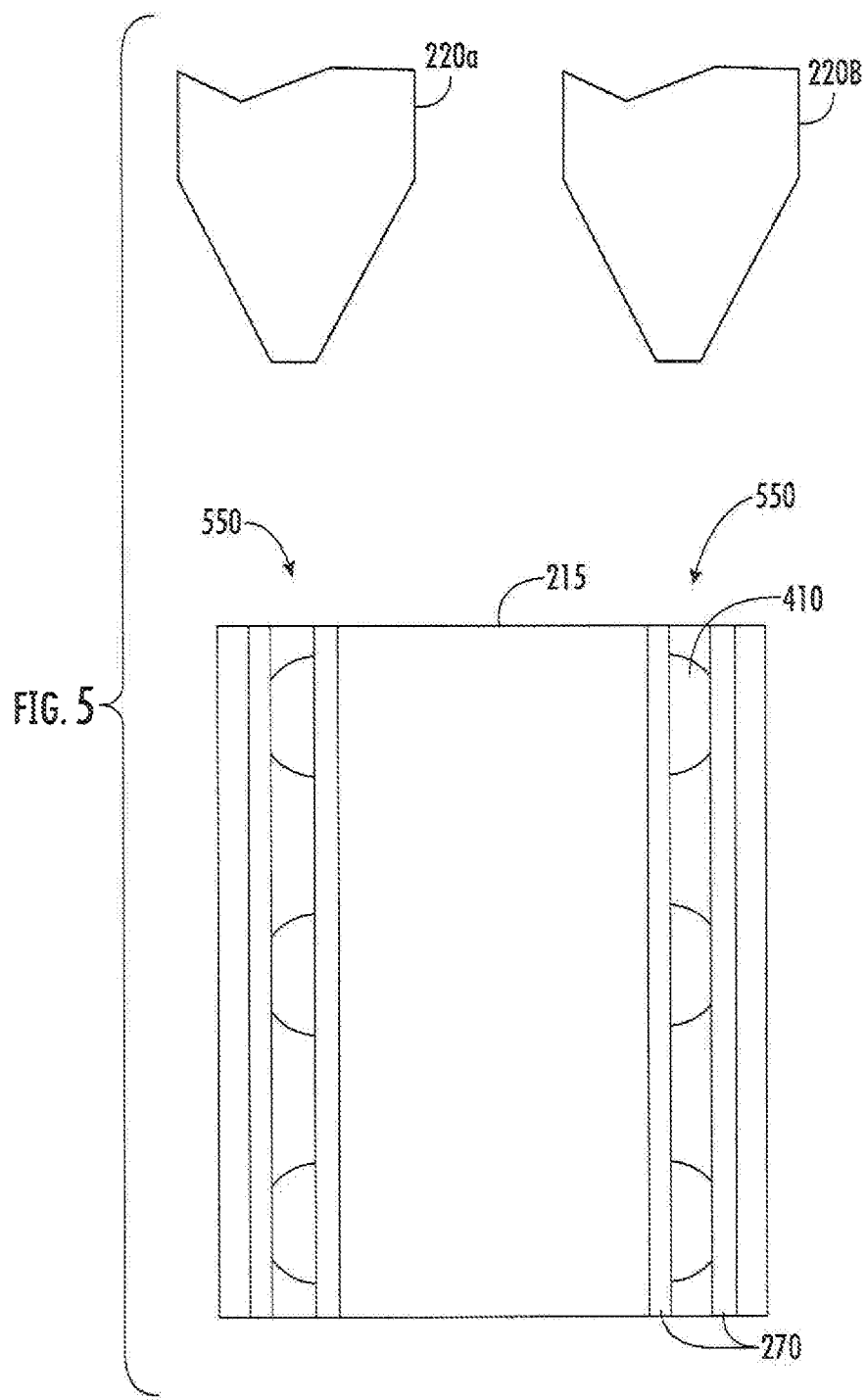

METHODS OF FORMING INTEGRATED CIRCUIT DEVICES USING CUTTING TOOLS TO EXPOSE METALLIZATION PADS THROUGH A CAP STRUCTURE AND RELATED CUTTING DEVICES

BACKGROUND

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Wireless data communications can utilize RF filters operating at frequencies around 5 GHz and higher. It is known to use Bulk acoustic Wave Resonators (BAWR) incorporating polycrystalline piezoelectric thin films for some applications. While some polycrystalline based piezoelectric thin film BAWRs may be adequate for filters operating at frequencies from about 1 to 3 GHz, applications at frequencies around 5 GHz and above may present obstacles due to the reduced crystallinity associated with such thin poly-based films.

SUMMARY

A method of fabricating a semiconductor device can include providing an integrated circuit electrically coupled to a metallization pad on a semiconductor wafer, the integrated circuit and the metallization pad covered by a cap structure. A channel can be cut in a portion of the cap structure that covers the metallization pad using a cutting tool having a tip surface and a beveled side surface to expose an upper surface of the metallization pad in the channel extending in a first direction and a conductive material can be deposited in the channel to ohmically contact the upper surface of the metallization pad in the channel.

BRIEF DESCRIPTION OF THE DRAWINGS

FIG. 5 is a schematic plan view of the device A having been processed with a cutting tool to form first and second channels exposing metallization pads of device A in some embodiments according to the invention.

DESCRIPTION OF EMBODIMENTS ACCORDING TO THE INVENTION

Figure 1A:
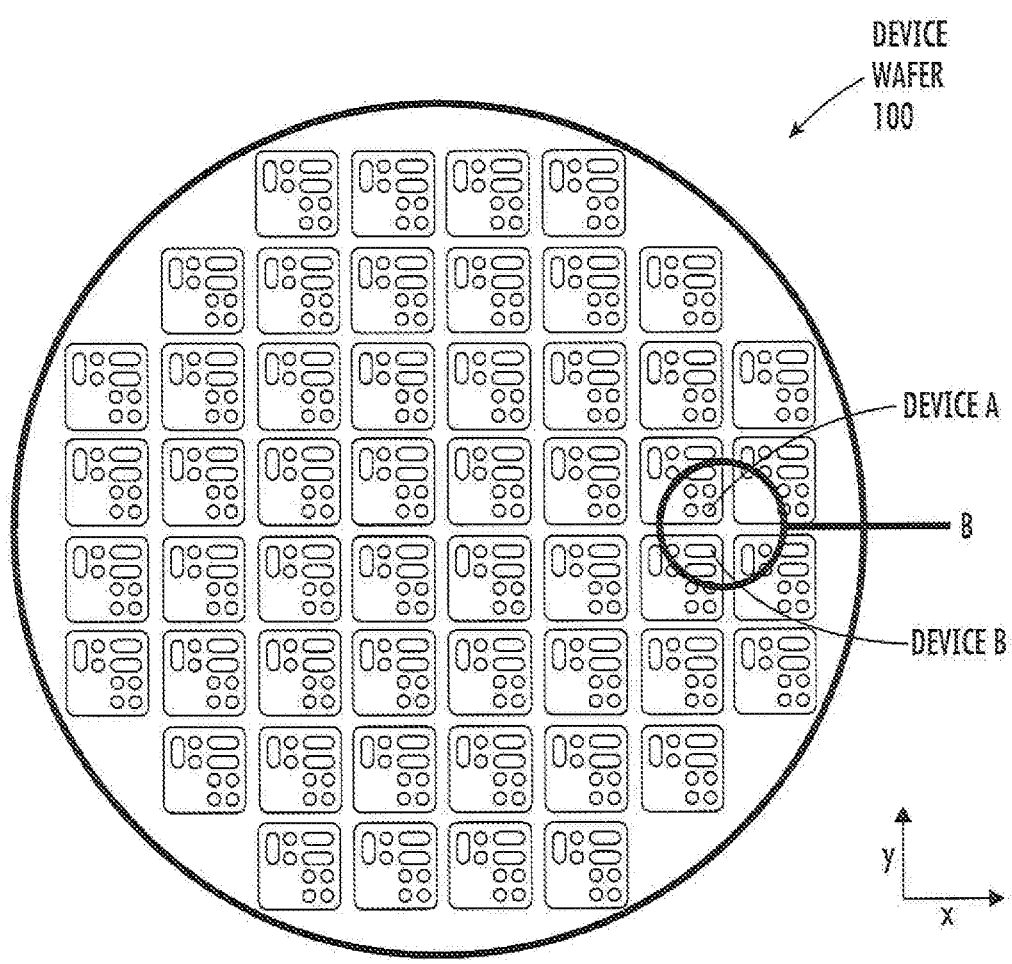
FIG. 1A is a schematic representation of a wafer having semiconductor devices A and B formed thereon in an arrangement suitable for singulation to separate the devices from one another for use in a wafer level integration format in some embodiments according to the invention.

According to the present invention, techniques generally related to electronic devices are provided. More particularly, the present invention provides techniques related to a method of manufacture and structure for, for example, bulk acoustic wave resonator devices, single crystal resonator devices, single crystal filter and resonator devices, and the like. These types of devices have been applied to a single crystal resonator device for communication devices, mobile devices, and computing devices, among others. It will be understood, however, that embodiments according to the invention, may be applied to any manufacturing process involving the singulation of devices fabricated on a wafer, regardless of the technology or application.

As appreciated by the present inventors, a cutting tool can be used to expose metallization pads of integrated circuit devices located on a wafer. In some embodiments, the cutting tool can be shaped to cut a channel through a wafer cap structure that is configured to reduce the likelihood of forming a void when depositing conductive material on the metallization pads that are exposed in the channel. For example, in some embodiments according to the invention, the cutting tool has a beveled side surface and a flat tip surface that can, when cutting the wafer cap, form the channel to expose the upper surface of metallization pads. The channel can therefore be formed to have beveled side walls that are tapered outward so that channel is wider at the top than at the bottom. As further appreciated by the present inventors, this tapered channel shape can allow improved contact between the deposited conductive material and the metallization pads when the conductive material is deposited on the pads.

In some embodiments, the beveled side surface of the cutting tool can form an angle with the tip surface that is in a range between about 60 degrees to about 85 degrees. In some embodiments, the cutting tool is wide enough to expose metallization pads of two adjacent devices on the wafer in a single pass and has opposing beveled side surfaces to impart a corresponding beveled side wall surface for each side of the channel adjacent to each device. In some embodiments, the cutting tool is wide enough to expose the metallization pads in a single row of metallization pads of a device in a single pass and has opposing beveled side surfaces to impart a corresponding beveled side wall surface for each side of the channel for that single row.

In some embodiments, the beveled side surface of the cutting tool can be a single beveled surface. For example, in some embodiments, the beveled side surface can have a height that is about equal to the depth that the cutting tool will cut into the wafer cap structure. In some embodiments, the beveled side surface of the cutting tool include two or more beveled side surfaces. In some embodiments, the beveled side surface can have a lower portion with a height that is about 50% of the depth that the cutting tool will cut into the wafer cap structure. In still further embodiments, the beveled side surface can have a first beveled portion that is beveled at a first angle and a second beveled portion that is beveled at a second angle.

In some embodiments, the cutting tool can be used to cut the wafer cap structure for a plurality of devices arranged in a first direction on the wafer. In some embodiments, the cutting tool can be used to cut the wafer cap structure for a plurality of devices arranged in first direction and second directions on the wafer. In some embodiments, the cutting tool can include more than one cutting portion where each portion is configured to cut a channel to expose the metallization pads for a different device on the wafer.

FIG. 1A is a schematic representation of a wafer 100 having a plurality of semiconductor devices formed thereon in an arrangement configured for singulation to separate the devices from one another for use in a wafer level integration format in some embodiments according to the invention. As shown in FIG. 1A, the semiconductor wafer 100 includes the plurality of integrated circuit devices in a two dimensional pattern in the X and Y dimensions. The integrated circuit devices are separated from one another in the x and y dimensions by scribe areas that extend across the wafer. The scribe areas may allow a dicing saw, or cutting device, to cut the wafer into pieces so that the devices can be separated from one another and assembled in the wafer level format. The scribe areas are typically devoid of active devices such as those described herein.

In some embodiments according to the invention, however, a cutting device can be used to cut into a wafer cap structure that covers the integrated circuit device to expose the metallization pads of the device rather than to cut through the wafer. In other words, the cutting tool that may be used to singulate the devices by cutting along the scribe areas may also be used to cut into the devices that are located between the scribe areas.

It will be understood that the integrated circuit devices shown in FIG. 1A can be any type of technology, such as a MEMS device or other integrated circuit device, that can be used to fabricate wafer level integrated packages as described herein. Accordingly, embodiments according to the present invention are not limited to a particular technology or even to a particular packaging type, but rather can be used in any process that removes capping material from the integrated circuits to expose mentalization pads.

It will be further understood that a cutting device saw is used to dice the wafer into pieces to separate the devices from one another. In some embodiments, according to the mentioned comma, however, the cutting device can be used to cut the wafer cap structure that covers the integrated circuit device to expose the metallization pads that are used to conduct signals to and from the integrated circuit device.

Figure 1B:
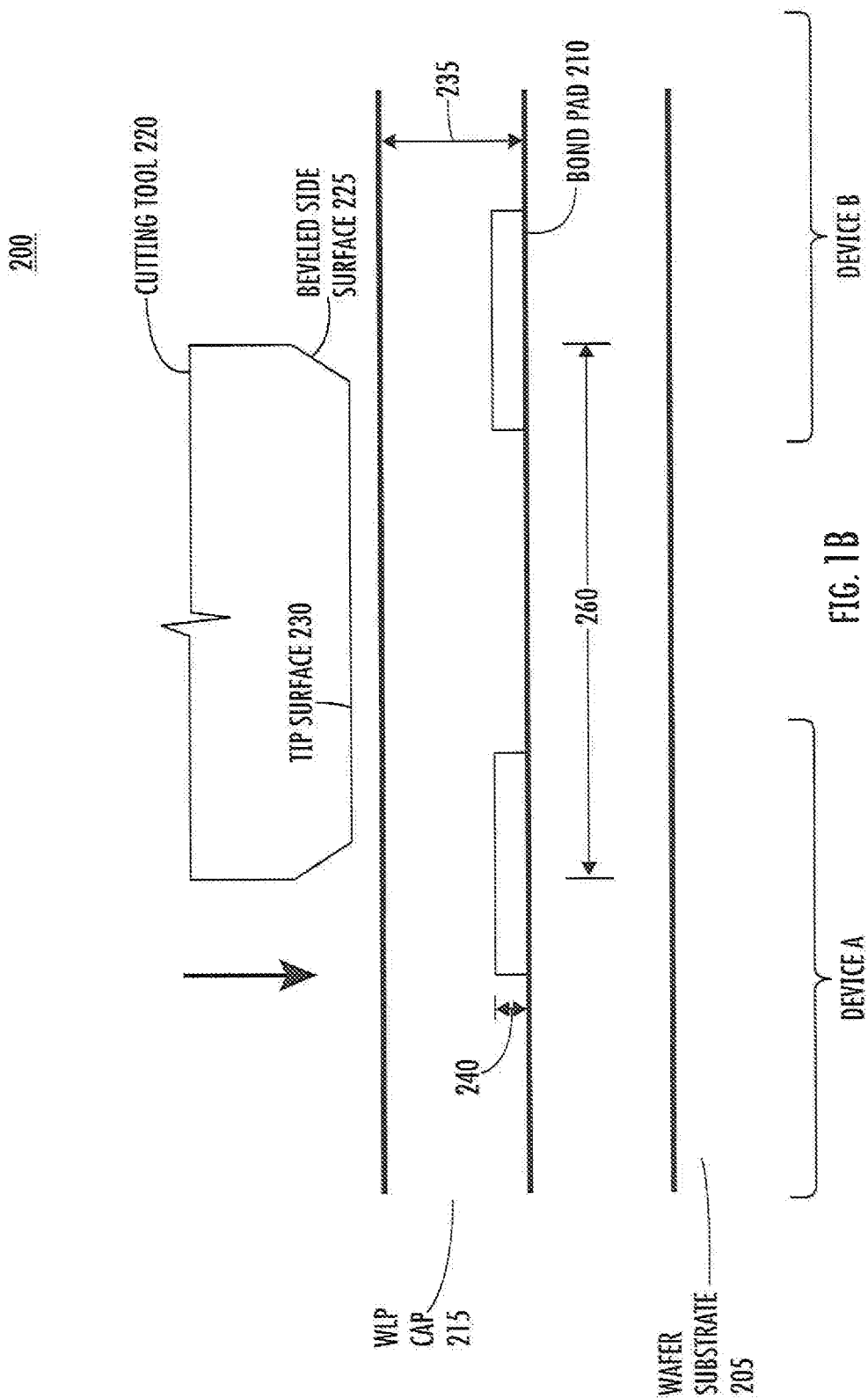
FIG. 1B is a cross-sectional view of the wafer of FIG. 1A in a position to expose metallization pads associated with Devices A and B using a cutting tool having a beveled side surface in some embodiments according to the invention.

FIG. 1B is a cross-sectional view of the wafer 100 of FIG. 1A in a position 200 to expose 210 metallization pads associated with devices A and B using a cutting tool 220 having beveled side surfaces 225 in some embodiments according to the invention. According to FIG. 1B, the cutting tool 220 includes a tip surface 230 that is generally flat relative to a surface on which the cutting tool two 20 is brought into contact. The cutting tool 220 also includes a beveled side surface 225 on each side of the tip surface 230. The beveled side surface 225 is angled relative to the tip surface 230 to define an angle that is in a range between about 85 degrees to 60 degrees as shown in FIG. 1B.

As further shown in FIG. 1B the wafer includes metallization pads 220 on a wafer substrate 205 which are covered by a wafer cap structure 215 having a thickness 235. It will be understood that the metallization pads 210 can be coupled to the integrated circuits A and B. The cutting tool 220 penetrates the cap structure 215 so that the tip surface 230 exposes the upper surface of the metallization pads 210. In some embodiments according to the invention, the cap structure 215 is about 50 microns to about 100 microns thick. Other thicknesses may also be used.

As further shown in FIG. 1B, the center portions of the metallization pads 210 can be spaced apart from one another by a distance in a range between about 50 um and 2000 um on the wafer substrate 205. It will be understood that the cutting tool 220 can therefore be sized to accommodate both the depth of the wafer cap structure 215 as well as the spacing between the metallization bond pads so that when the cutting tool 220 cuts through the wafer cap structure 215 to contact the metallization pads 210, a channel is formed in the wafer cap structure 215 between the devices such that the channel has a side wall profile that conforms to the beveled side surfaces 225 of the cutting tool 220.

Figure 1C:
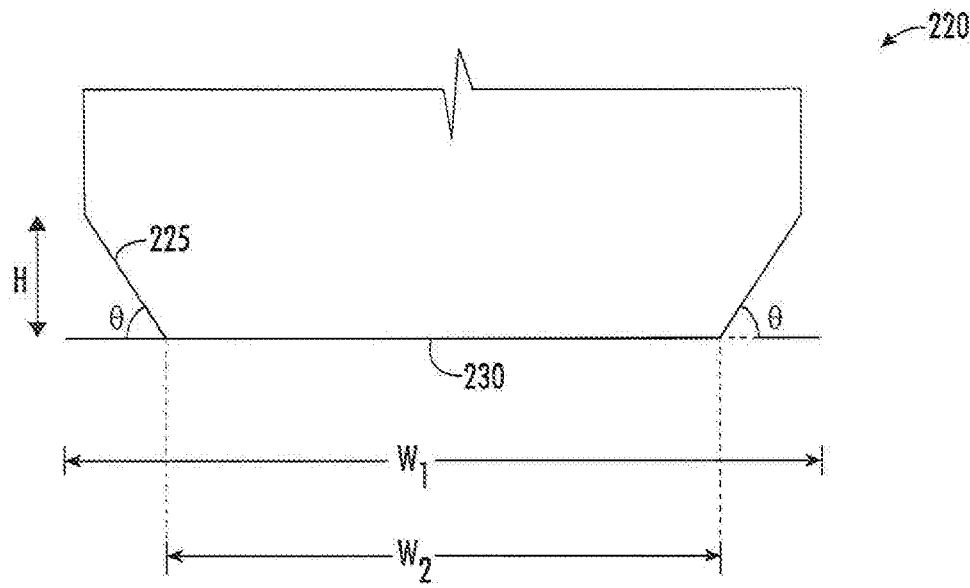
FIG. 1C is a cross-sectional view of the cutting tool of FIG. 1B showing a detailed view of the beveled side surface relative to the tip surface of the cutting tool and the angle formed therebetween in some embodiments according to the invention.

FIG. 1C is a cross-sectional view of the cutting tool 220 of FIG. 1B showing a detailed view of the beveled side surfaces 225 relative to the tip surface 220 of the cutting tool 220 and the angle formed therebetween in some embodiments according to the invention. According to FIG. 1C the cutting tool 220 has a width W1 that extends from a first flat portion of the sidewall to the other sidewall, whereas a second width W2 is measured from where the beveled side surface meets the flat tip surface 230. As further shown in FIG. 1C the beveled side surface 225 of the cutting tool 220 forms an angle Θ with the tip surface 230. In some embodiments according to the invention, the angle Θ formed between the beveled side surface 225 and the flat tip surface 230 is in a range between about 60 degrees to about 85 degrees.

As further shown in FIG. 1C, a height H of the beveled side surface 225 is sized so as to approximately be the depth that the cutting tool 220 will be placed into the cap structure 215 so that the metallization pads 210 are exposed, and the side wall of the channel 250 formed by the cutting tool 220 is beveled to have the same angle as that of the beveled side surface 225.

Figure 1D:
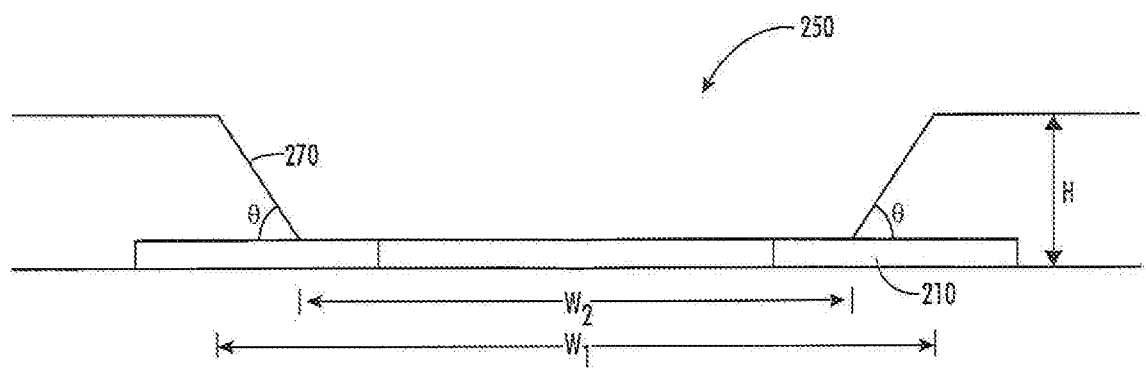
FIG. 1D is a cross-sectional view of the metallization pads of devices A and B exposed using the cutting tool of FIG. 1B to form a channel in the wafer cap structure having first and second beveled side walls, where each beveled side wall is associated with one of the devices A or B in some embodiments according to the invention.

FIG. 1D is a cross-sectional view of the metallization pads 210 of devices A and B exposed using the cutting tool 220 of FIG. 1B to form a channel 250 in the wafer cap structure 215 having first and second beveled side walls 270, where each beveled side wall 270 is associated with one of the devices A or B in some embodiments according to the invention.

According to FIG. 1D the cutting tool 220 is removed from the wafer 100 to leave behind the channel 250 that exposes the upper surfaces of the metallization pads 210. As further shown in FIG. 1D, the channel 250 is also characterized as having sidewalls 270 that are beveled to have the same angle is defines the beveled side surfaces 225 of the cutting tool 220 to form the angle Θ relative to the upper surface of the metallization pad 210. The cap structure 215 has a height of about H which corresponds to the height of the beveled side surface 225 of the cutting tool 220. As shown in FIG. 1D the width of the channel 250 at the base of the beveled side walls 270 is W2 whereas the width at the opening of the channel 250 is W1 which is wider than W2. Accordingly, the side walls 270 of the channel 250 are tapered outward due to the shape of the beveled side surface side wall 225 of the cutting tool 220.

Figure 2:
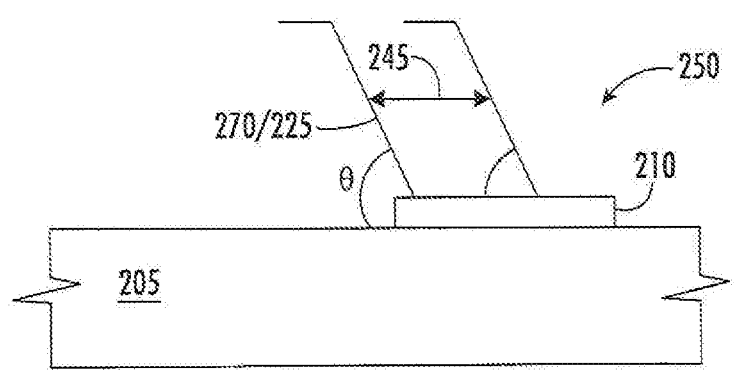
FIG. 2 is a cross-sectional view of the metallization pad of device A exposed using a cutting tool to form a channel in the wafer cap structure to form a beveled side wall that is positioned to expose at least 20% of the upper surface of the metallization pad in some embodiments according to the invention.

FIG. 2 is a cross-sectional view of the metallization pad 210 of device A exposed using the cutting tool 220 to form the channel 250 in the wafer cap structure 215 to form the beveled side wall 270 that is positioned to expose at least 20% of the upper surface of the metallization pad 210 in some embodiments according to the invention. According to FIG. 2 the cap structure 215 is cut by the cutting tool 220 to form the beveled sidewall 270 via the beveled side surface 225 so that the channel 250 exposes at least 20% of the surface area of the metallization pad 210. For example, as shown in FIG. 2 the position or with of the cutting tool 220 can be adjusted so that approximately all of the metallization pad 210 is exposed when the cutting tool processes the cap structure 215. In contrast, if the with W2 of the cutting tool 220 is reduced, the position of side wall of the channel 250 can be moved by an amount 245 so that less of the metallization pad 210 is exposed in the channel 250. In some embodiments according to the invention, the minimum amount of the metallization pad 210 that is exposed in the channel 250 is about 20%. It will also be understood however, that the angle formed in either position, maybe the same.

Figure 3:
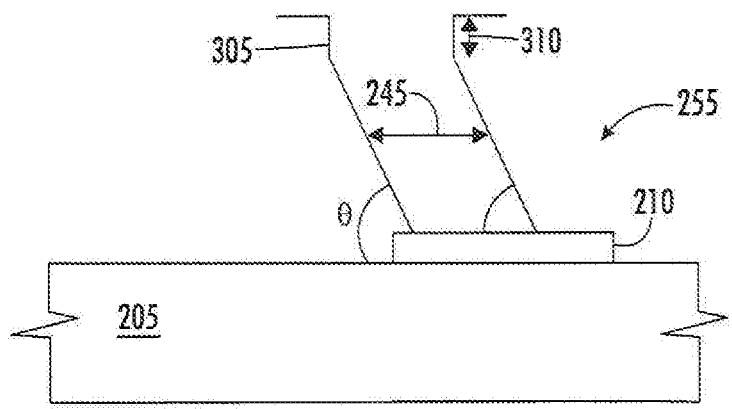
FIG. 3 is a cross-sectional view of the metallization pad of device A exposed using a cutting tool to form a channel in the wafer cap structure having a beveled side wall that includes at least two portions that each form different angles in some embodiments according to the invention.

FIG. 3 is a cross-sectional view of the metallization pad 210 of device A exposed using the cutting tool 220 to form the channel 250 in the wafer cap structure 215 having the beveled side wall 270 that includes at least two portions that each form different angles in some embodiments according to the invention. According to FIG. 3 the cutting tool 220 has more than one portion of the beveled side wall surface 225. In particular as shown in FIG. 3 the beveled side surface 225 includes a first portion 302 to that defines a lower portion of the beveled side surface 225 and an upper portion 305 that defines an upper portion of the beveled side surface 225. It will be understood that each of the portions 302 and 305 can form different angles relative to the metallization pad 210. As further shown in FIG. 3 the width of the cutting tool 210 can also be adjusted to move the beveled sidewall of the channel 255 to expose more or less of the surface area of the metallization pad 210 as described above in reference to FIG. 2.

Figure 4A:
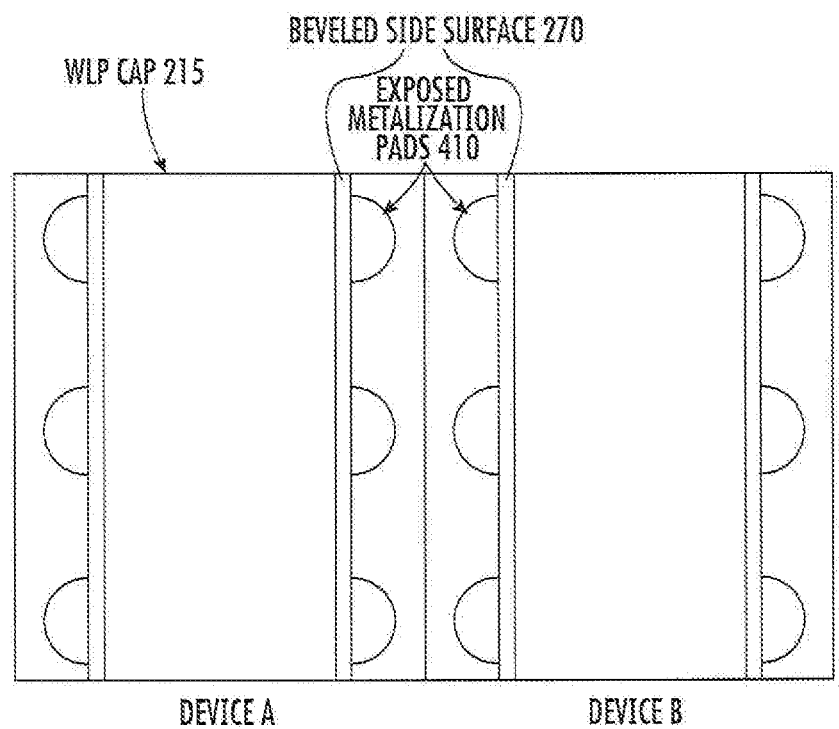
FIG. 4A is a schematic top view of the devices A and B of FIGS. 1A and 1B having been processed with the cutting tool to form the channel exposing the respective metallization pads of devices A and B in some embodiments according to the invention.

FIG. 4A is a schematic top view of the devices A and B of FIGS. 1A and 1B having been processed with the cutting tool 220 to form the channel 250 exposing the respective metallization pads 210 of devices A and B in some embodiments according to the invention. According to FIG. 4A multiple passes have been made on the wafer 100 to expose the metallization pads 210 on both sides of the devices A and B. In particular, the center portion between the devices A and B has been processed to expose the underlying metallization pads in the channel 250 as well as the metallization pads 210 on the opposite side of each of the devices A and B. Accordingly, in some embodiments according to the invention, the cutting tool 220 can be used to process the devices on the wafer by running the cutting tool 220 from one and of the wafer to the other end so that all of the devices can be processed as described herein.

Figure 4B:
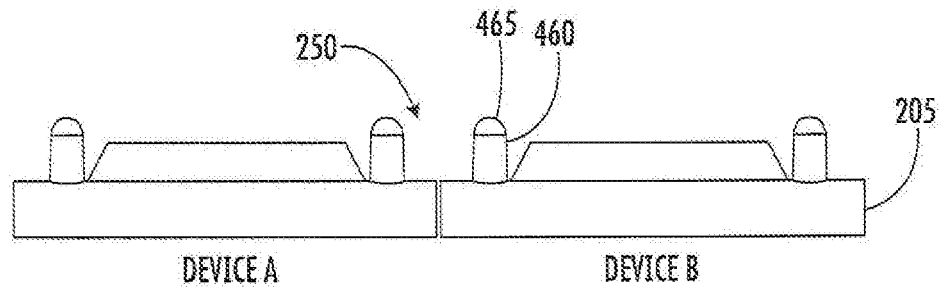
FIG. 4B is a schematic cross-sectional view of the devices A and B of FIGS. 1A and 1B having been processed with the cutting tool to form the channel exposing the respective metallization pads having conductive material formed thereon in some embodiments according to the invention.

FIG. 4B is a schematic cross-sectional view of the devices A and B of FIGS. 1A and 1B having been processed with the cutting tool 220 to form the channel 250 exposing the respective metallization pads 210 having conductive material formed thereon to provide conductive pillars 460 and solder caps 465 in some embodiments according to the invention. According to FIG. 4B, the devices A and B are further processed to deposit conductive material in the channel 250 to provide conductive pillars 460 and solder caps 465 thereon. Accordingly, the combination of the metallization pads 210, the conductive pillars 460 and the solder caps 465 can provide an ohmic contact to the devices on the wafer 100.

FIG. 5 is a schematic plan view of the device A having been processed with the cutting tool 220 to form first and second channels 250 exposing metallization pads 210 of device A in some embodiments according to the invention. According to FIG. 5 the device shown has been processed using a pair of cutting tools 220A and 220B, each of which may be dedicated to processing a particular side of the integrated circuit device. As further shown in FIG. 5 the cutting tool 220A forms a channel 250 on the left side of the device and the cutting tool 220B forms a channel 250 on the right side of the device. Each of the channels exposes a respective set of mobilization pads for 10 on the device. As further shown in FIG. 5 each of the channels formed by the pair of cutting tools 220A and 220B has imparted the beveled sidewalls 272 to each of the channels as described herein.

Figure 6:
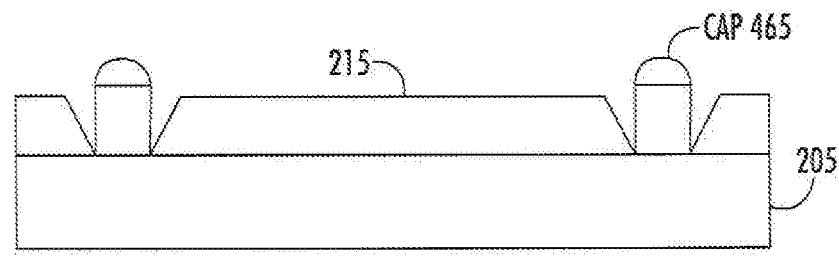
FIG. 6 is a schematic cross-sectional view of the device A of FIG. 5 having been processed to form conductive material in the channels on the exposed metallization pads in some embodiments according to the invention.

FIG. 6 is a schematic cross-sectional view of the device A of FIG. 5 having been processed to form conductive material in the channels 250 on the exposed metallization pads 210 in some embodiments according to the invention. According to FIG. 6 the device shown therein has been processed by the pair of cutting tools 220A and 220B and further has been processed by depositing conductive material in each of the channels 270 followed by the formation of the conductive pillars 460 and conductive solder caps 465 in some embodiments according to the invention.

FIGS. 7-12 are schematic plan views of the device A having been processed with a cutting tool to form channels exposing metallization pads of the device A in some embodiments according to the invention. According to FIG. 7 the device shown therein has been processed to expose the metallization pads 210 in both the X and Y dimensions by, for example, running the cutting tool 220 in both the X and Y dimensions as described herein.

Figure 7:
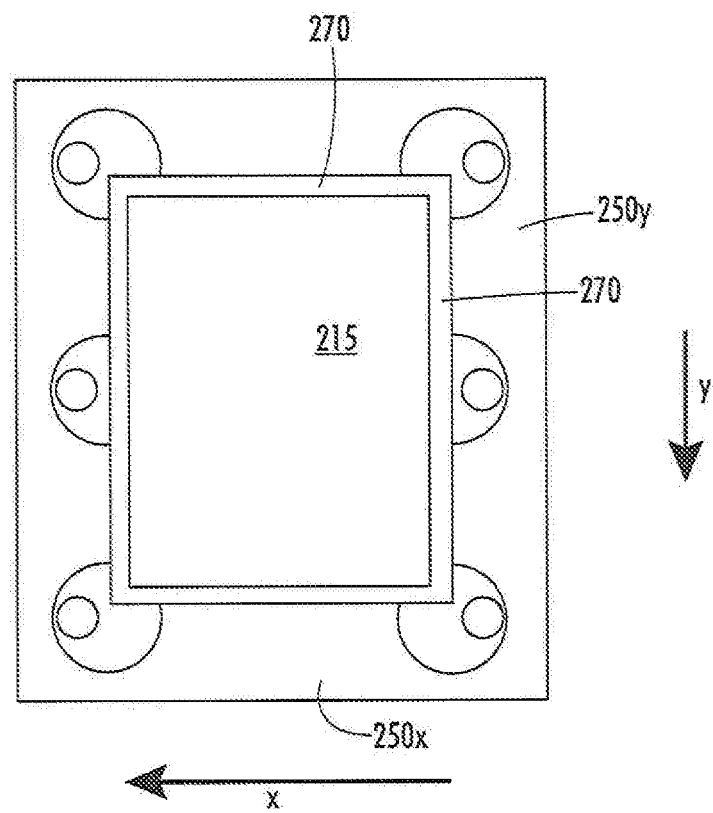
FIGS. 7-12 are schematic plan views of the device A having been processed with a cutting tool to form channels exposing metallization pads of the device A in some embodiments according to the invention.
Figure 8:
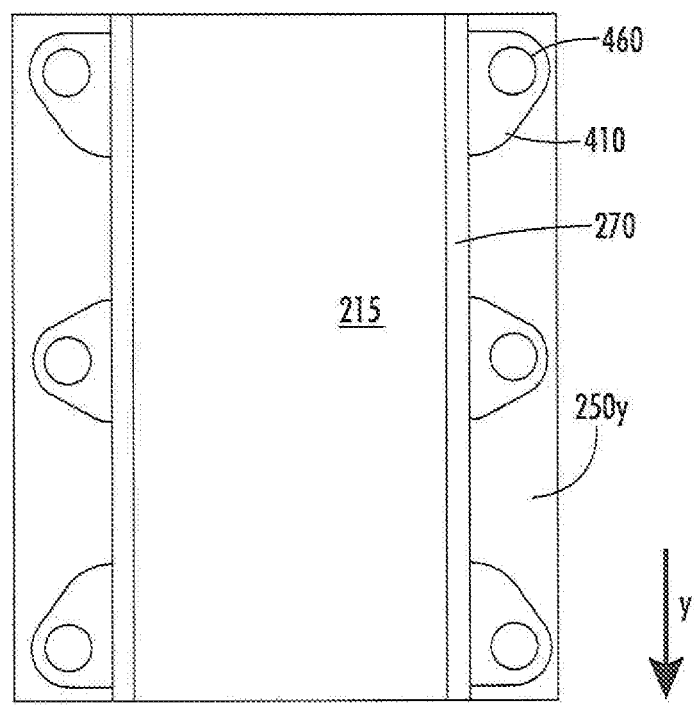
Figure 9:
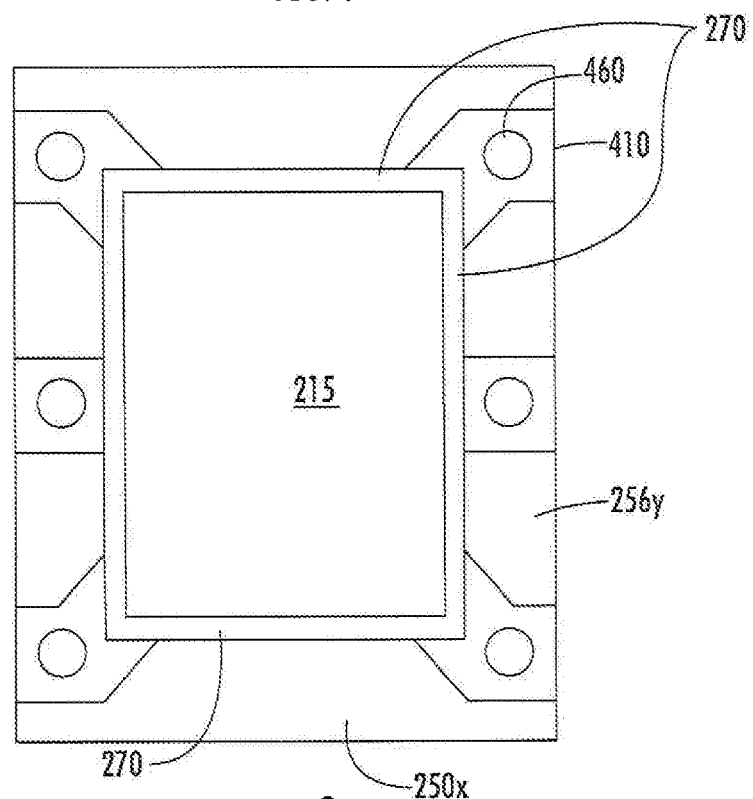

As further shown in FIG. 7 the cap structure 215 has been removed by the cutting tool 220 in the X and Y dimensions on both sides of the device to form channels 250x and 250y having the beveled side wall 270 and to expose the conductive pads 210 so that the conductive pillars 460 can be formed thereon. In FIG. 8 the cutting tool 220 has been run in the Y direction as shown to expose the metallization pads 210. According to FIG. 9 the cutting tool 220 has been used to process the wafer in both the X and Y dimensions to expose the metallization pads 210 in both the X and Y dimensions and to impart the cap structure 215 with the beveled sidewall 270.

Figure 10:
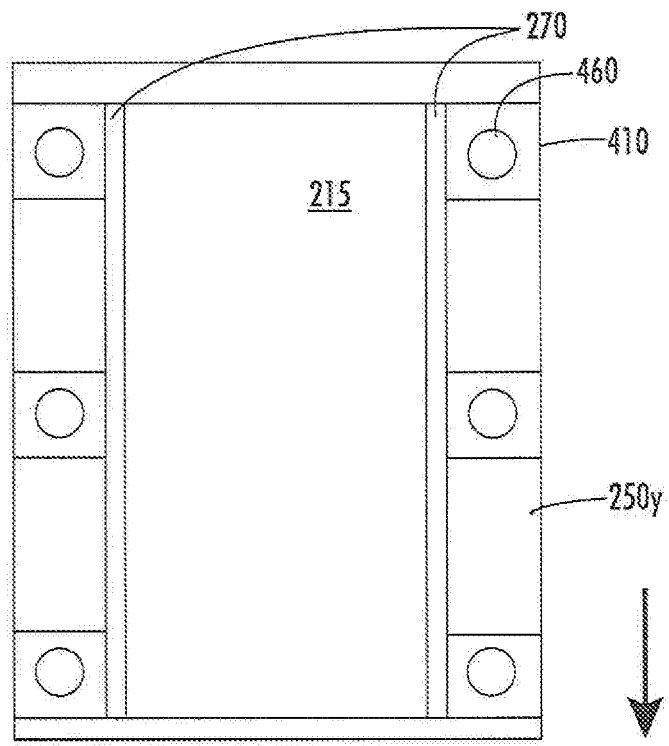
Figure 11:
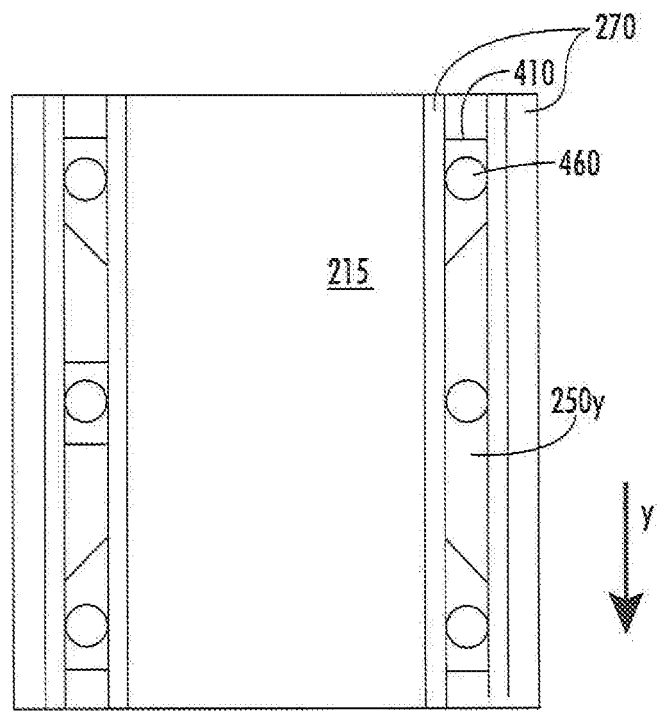
Figure 12:
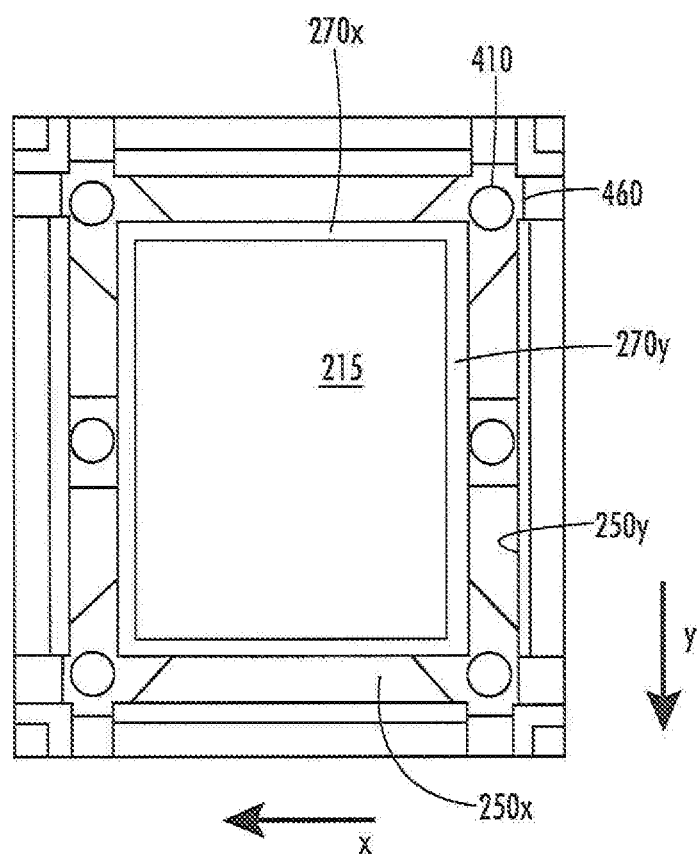

According to FIG. 10 the cutting tool 220 has been used to process the wafer in the Y dimension to expose the metallization pads 210 so that the conductive material and pillars 460 may be formed. As shown in FIG. 10 the cap structure 215 has been processed by the cutting tool 220 to form the beveled side wall 270. According to FIG. 11 the cutting tool 220 has been used to process the wafer in the Y dimension so that a relatively narrow portion of the material covering the metallization pads 410 has been removed to form the channel 250y having the beveled side walls 270. As shown in FIG. 12 the cutting tool 220 has been used to process the wafer in both the X and Y dimensions to form channels 250y and 250x having the beveled side wall surfaces 270 exposing the metallization pads 410.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed is:

1. A method of fabricating a semiconductor device, the method comprising:
providing an integrated circuit electrically coupled to a metallization pad on a semiconductor wafer, the integrated circuit and the metallization pad covered by a cap structure;
cutting a channel in a portion of the cap structure that covers the metallization pad using a cutting tool having a tip surface and a beveled side surface to expose an upper surface of the metallization pad in the channel extending in a first direction; and
depositing a conductive material in the channel to ohmically contact the upper surface of the metallization pad in the channel.

2. The method of claim 1 wherein the tip surface and a portion of the beveled side surface, that is adjacent to the tip surface, form an angle in a range between about 60 degrees to about 85 degrees.

3. The method of claim 2 wherein the metallization pad has a thickness in a range between about 1.5 microns to about 2 microns.

4. The method of claim 3 wherein the beveled side surface forms a beveled side wall in the channel relative to the upper surface of the metallization pad.

5. The method of claim 1 wherein a height of the beveled side surface is at least about 50% of a thickness of the cap structure.

6. The method of claim 5 wherein a side surface of the cutting tool above the beveled side surface and the tip surface form an angle that is in a range between about 60 degrees to about 90 degrees.

7. The method of claim 1 wherein the channel has a width that exposes at least about 20% of the upper surface of the metallization pad.

8. The method of claim 1 wherein cutting the channel in the portion of the cap structure comprises moving the cutting tool across the semiconductor wafer within the cap structure to form the channel exposing the upper surface of the metallization pad.

9. The method of claim 1 wherein the cutting tool comprises a rotating blade or a rotating wire.

10. The method of claim 1 wherein a thickness of the cap structure is in a range between about 50 um to about 100 um.

11. The method of claim 1 wherein the cap structure comprises glass or polymer material.

12. A method of fabricating a semiconductor device, the method comprising:
providing an integrated circuit electrically coupled to a metallization pad on a semiconductor wafer, the integrated circuit and the metallization pad covered by a cap structure;
cutting a channel in a portion of the cap structure that covers the metallization pad using a cutting tool having a tip surface and a beveled side surface to expose an upper surface of the metallization pad in the channel extending in a first direction; and
depositing a conductive material in the channel to ohmically contact the upper surface of the metallization pad in the channel, wherein providing the integrated circuit electrically coupled to the metallization pad on the semiconductor wafer comprises:
providing the integrated circuit electrically coupled to a first metallization pad on the semiconductor wafer and a second metallization pad that is electrically coupled to the integrated circuit; and
wherein cutting the channel in the portion of the cap structure comprises moving the cutting tool across the semiconductor wafer in the first direction within the cap structure to form the channel exposing the upper surface of the first metallization pad and an upper surface of the second metallization pad.

13. The method of claim 12 wherein the integrated circuit comprises a first integrated circuit, the method further comprising:
a second integrated circuit, separated from the first integrated circuit in the first direction on the semiconductor wafer, the second integrated circuit electrically coupled to a third metallization pad, aligned to the first and second metallization pads in the first direction and covered by the cap structure, on the semiconductor wafer; and wherein cutting the channel in the portion of the cap structure comprises moving the cutting tool across the semiconductor wafer in the first direction within the cap structure to form the channel exposing the upper surface of the first metallization pad, the upper surface of the second metallization pad, and the upper surface of the third metallization pad; and depositing the conductive material in the channel to ohmically contact the upper surfaces of the first, second, and third metallization pads in the channel.

14. A method of fabricating a semiconductor device, the method comprising:

providing an integrated circuit electrically coupled to a metallization pad on a semiconductor wafer, the integrated circuit and the metallization pad covered by a cap structure;

cutting a channel in a portion of the cap structure that covers the metallization pad using a cutting tool having a tip surface and a beveled side surface to expose an upper surface of the metallization pad in the channel extending in a first direction; and depositing a conductive material in the channel to ohmically contact the upper surface of the metallization pad in the channel, wherein the integrated circuit comprises a first integrated circuit electrically coupled to the metallization pad comprising a first metallization pad and covered by the cap structure comprising a first cap structure, the method further comprising:

a second integrated circuit, separated from the first integrated circuit in a second direction orthogonal to the first direction on the semiconductor wafer, the second integrated circuit electrically coupled to a second metallization pad and covered by a second cap structure, on the semiconductor wafer; and wherein cutting the channel in the portion of the cap structure comprises moving the cutting tool across the semiconductor wafer in the first direction within the first and second cap structures between the first and second integrated circuits to form the channel exposing the upper surface of the first metallization pad and an upper surface of the second metallization pad; and depositing the conductive material in the channel to ohmically contact the upper surfaces of the first and second metallization pads in the channel.

15. The method of claim 14 wherein the beveled side surface of the cutting tool comprises a first beveled side surface facing the first integrated circuit, the cutting tool further comprising:

a second beveled side surface facing the second integrated circuit, wherein the tip surface extends from the first beveled side surface to the second beveled side surface.

16. The method of claim 15 wherein the tip surface and a portion of the first beveled side surface, that is adjacent to the tip surface, form a first angle in a range between about 60 degrees to about 85 degrees and wherein the tip surface and a portion of the second beveled side surface, that is adjacent to the tip surface, form a second angle in a range between about 60 degrees to about 85 degrees.

17. The method of claim 16 wherein the channel has a width that exposes at least about 20% of the upper surface of the first metallization pad and about 100% of the upper surface of the second metallization pad.

18. A method of fabricating a semiconductor device, the method comprising:

providing an integrated circuit electrically coupled to a metallization pad on a semiconductor wafer, the integrated circuit and the metallization pad covered by a cap structure;

cutting a channel in a portion of the cap structure that covers the metallization pad using a cutting tool having a tip surface and a beveled side surface to expose an upper surface of the metallization pad in the channel extending in a first direction; and depositing a conductive material in the channel to ohmically contact the upper surface of the metallization pad in the channel, wherein ohmic contact between the conductive material in the channel and the upper surface of the metallization pad a specific contact resistivity of less than about 10 e-03 ohm$^2$.

19. A method of fabricating a semiconductor device, the method comprising:

sawing a channel in a cap structure that covers a semiconductor wafer, using a cutting tool having a tip surface wide enough to expose metallization pads of two directly adjacent devices on the semiconductor wafer in a single pass and having opposing beveled side surfaces to impart a corresponding beveled side wall surface in each side of the channel adjacent to each device; and depositing a conductive material in the channel to ohmically contact an upper surface of the metallization pads in the channel.

20. The method of claim 19 wherein the corresponding beveled side wall surface in each side of the channel form an angle with a surface of the semiconductor wafer in a range between about 60 degrees to about 85 degrees.

21. A method of fabricating a semiconductor device, the method comprising:

providing devices electrically coupled to metallization pads on a semiconductor wafer covered by a cap structure; and sawing a channel in the cap structure that covers the semiconductor wafer using a cutting tool having a tip surface wide enough to expose a row of metallization pads of a device on the semiconductor wafer, the channel having opposing beveled side surfaces to impart a corresponding beveled side wall surface in each side of the channel, wherein the corresponding beveled side wall surface in each side of the channel form an angle with a surface of the semiconductor wafer in a range between about 60 degrees to about 85 degrees.

* * * * *